(12) United States Patent
Chen et al.

(10) Patent No.: US 7,712,615 B2
(45) Date of Patent: May 11, 2010

(54) SUPPORT SLIDE ASSEMBLY FOR CABLE MANAGEMENT ARM

(75) Inventors: Ken-Ching Chen, Kaohsiung Hsien (TW); Shih-Long Hwang, Kaohsiung Hsien (TW); Shun-Ho Yang, Kaohsiung Hsien (TW); Chun-Chiang Wang, Kaohsiung Hsien (TW)

(73) Assignee: King Slide Works Co., Ltd., Kaohsiung Hsien (TW)

( * ) Notice: Subject to any disclaimer, the term of this patent is extended or adjusted under 35 U.S.C. 154(b) by 0 days.

(21) Appl. No.: 12/324,968

(22) Filed: Nov. 28, 2008

(65) Prior Publication Data

US 2009/0078834 A1    Mar. 26, 2009

Related U.S. Application Data

(63) Continuation-in-part of application No. 11/014,976, filed on Dec. 20, 2004, now abandoned, and a continuation-in-part of application No. 10/964,708, filed on Oct. 15, 2004, now abandoned.

(51) Int. Cl.
*A47F 7/00* (2006.01)

(52) U.S. Cl. .................. 211/26; 211/187; 361/826; 312/223.2; 174/69

(58) Field of Classification Search .......... 211/26, 211/175, 189, 187; 312/223.2, 330.1, 265.1, 312/265.4; 361/826, 727, 829, 683; 174/69
See application file for complete search history.

(56) References Cited

U.S. PATENT DOCUMENTS

| | | | | |
|---|---|---|---|---|
| 2,865,979 A * | 12/1958 | Klassen | .................. | 174/69 |
| 3,399,909 A * | 9/1968 | Ambrose | .................. | 285/61 |
| 3,448,346 A * | 6/1969 | Mchaffie | .................. | 361/827 |
| 3,551,612 A * | 12/1970 | Guentner | .................. | 191/12 C |
| 3,647,936 A * | 3/1972 | Dryg | .................. | 174/69 |
| 3,710,199 A * | 1/1973 | Cignoni, Jr. | .................. | 361/827 |
| 4,353,518 A * | 10/1982 | Taylor et al. | .................. | 248/60 |
| 4,614,383 A * | 9/1986 | Polley et al. | .................. | 312/273 |
| 5,276,589 A * | 1/1994 | Bartlett et al. | .................. | 361/679.06 |
| 5,571,256 A * | 11/1996 | Good et al. | .................. | 211/26 |
| 6,303,864 B1 * | 10/2001 | Johnson et al. | .................. | 174/69 |
| 6,305,556 B1 * | 10/2001 | Mayer | .................. | 211/26 |
| 6,442,030 B1 * | 8/2002 | Mammoser et al. | .................. | 361/727 |
| 6,681,942 B2 * | 1/2004 | Haney | .................. | 211/183 |
| 6,747,874 B2 * | 6/2004 | McKinnon et al. | .................. | 361/724 |
| 6,772,887 B2 * | 8/2004 | Audibert et al. | .................. | 211/26 |
| 6,974,037 B2 * | 12/2005 | Haney | .................. | 211/26 |
| 7,009,112 B1 * | 3/2006 | Mead et al. | .................. | 174/69 |
| 7,472,795 B2 * | 1/2009 | Dubon et al. | .................. | 211/26 |

(Continued)

*Primary Examiner*—Kimberly T Wood
(74) *Attorney, Agent, or Firm*—Rosenberg, Klein & Lee

(57) ABSTRACT

A support slide assembly for a cable management arm is coupled with two slide assemblies. Two ends of the cable management arm are connected to one of the two slide assemblies. The support slide assembly includes a sliding member provided between the two ends of the cable management arm and sustained by the support slide assembly to travel in relation to the support slide assembly. Two ends of the support slide assembly respectively connected to the two slide assemblies. The support slide assembly includes a first rod and a second rod sliding into each other to become one retractable piece, allowing change of its total length. The two rods of the support slide assembly each is pivoted to a sliding block.

4 Claims, 7 Drawing Sheets

U.S. PATENT DOCUMENTS

| | | | |
|---|---|---|---|
| 7,554,819 B2 * | 6/2009 | Chen et al. | 361/826 |
| 2002/0179781 A1 * | 12/2002 | Timm | 248/118 |
| 2003/0026084 A1 * | 2/2003 | Lauchner | 361/826 |
| 2003/0222034 A1 * | 12/2003 | Champion et al. | 211/26 |
| 2004/0079711 A1 * | 4/2004 | Hartman et al. | 211/26 |
| 2004/0182798 A1 * | 9/2004 | Williams | 211/26 |
| 2005/0145582 A1 * | 7/2005 | Dubon et al. | 211/26 |

* cited by examiner

US 7,712,615 B2

SUPPORT SLIDE ASSEMBLY FOR CABLE MANAGEMENT ARM

This is a continuation-in-part application of application Ser. No. 10/964,708 filed Oct. 15, 2004 and Ser. No. 11/014,976 filed Dec. 20, 2004, now pending.

BACKGROUND OF THE INVENTION (a) Field of the Invention

This invention relates to a support slide assembly for a cable management arm, and more particularly to a support slide assembly adapted to the cable management arm.

(b) Description of the Prior Art

A conventional electronic product, such as a server, mounted on a slide-in chassis, has been provided on its both sides each a slide to travel on both slides, and a cable management arm to contain and restrict the cable.

As taught in U.S. Pat. Nos. 4,353,518, 4,614,383, 5,571,256, 6,303,864B1, 6,305,556B1, 6,442,030B1, 6,600,665B1, and US Patent Application Nos. 2003/0026084A1, 2003/0222034A1, and 2004/0079711A1, the cable management arm is usually adapted with two slides having two ends as supports. A retractable member, generally in the form of a hinge, is provided between the two ends of the cable management arm. The retractable member when retracted is suspended to stay away from either end. However, the retractable member of the cable management arm tends to droop over a certain period of time to negatively affect the operation in a highly intensively slide-in space due to the mass of the cable and the cable management arm.

SUMMARY OF THE INVENTION

The primary purpose of the present invention is to provide a support slide assembly for a cable management arm having a first end and a second end in conjunction with a first slide assembly and a second slide assembly each including a first slide rail, a second slide rail slidably connected to the first slide rail, and a third slide rail slidably connected to the second slide rail, the first end of the cable management arm being connected to the first slide rail of the first slide assembly and the second end of the cable management arm being connected to the third slide rail of the first slide assembly, the support slide assembly comprising:

a first rod pivotably connected to the second slide rail of the first slide assembly so that the first rod synchronously travels with the second slide rail of the first slide assembly;

a second rod slidably connected to the first rod;

a sliding member provided between the first and second ends of the cable management arm, the sliding member being slidably connected to the first rod; and a second sliding block movably connected to the second rod, the second sliding block being further connected to the second slide assembly;

wherein the sliding member is able to slide in the first rod when the cable management arm is stretched out or retracted;

wherein the first and second rods are movable and in a position at a certain inclination in relation to the first and second slide assemblies when the cable management arm is stretched out.

DETAILED DESCRIPTION OF THE PREFERRED EMBODIMENTS

Figure 1:
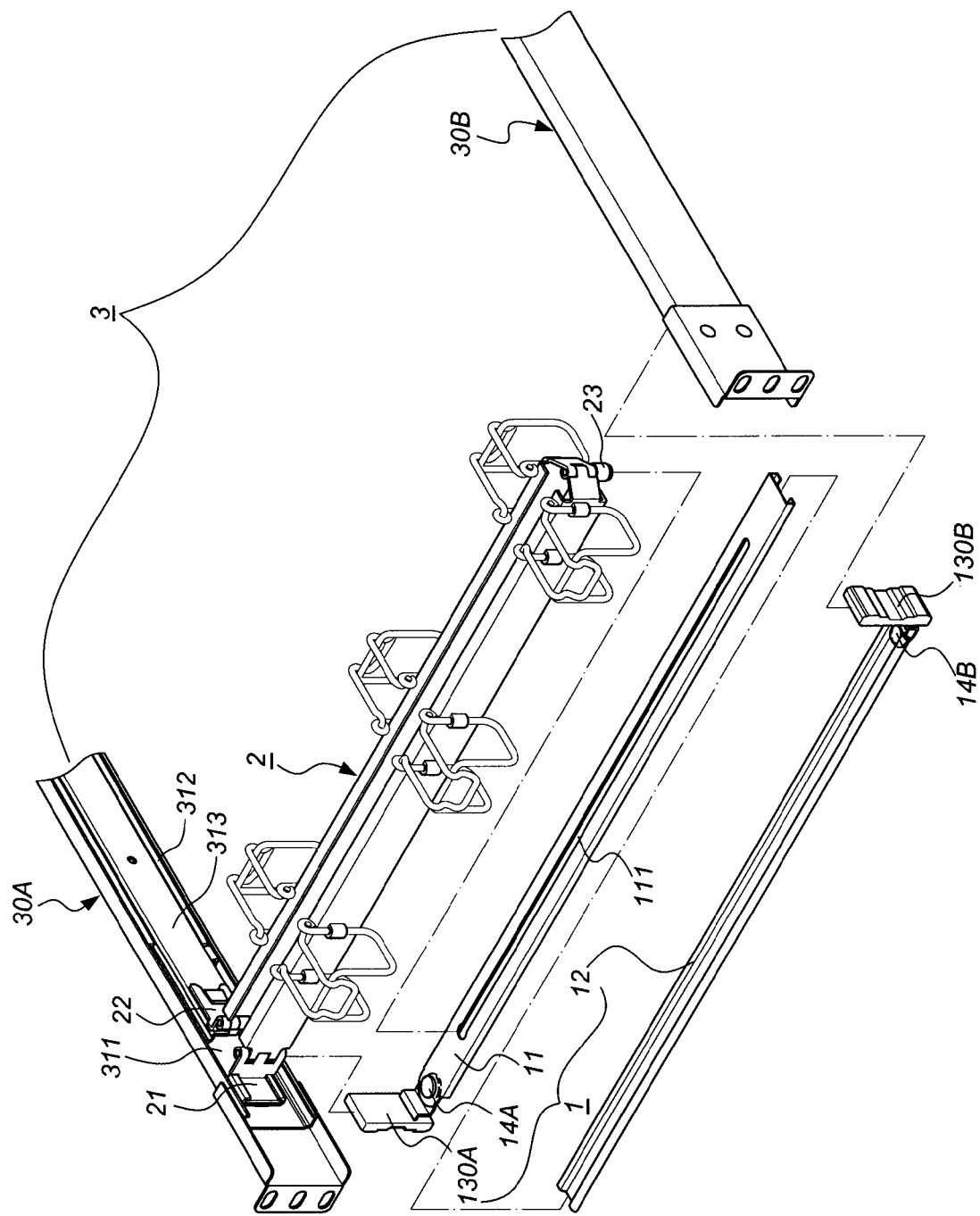
FIG. 1 is an exploded view of a first preferred embodiment of the present invention.
Figure 2:
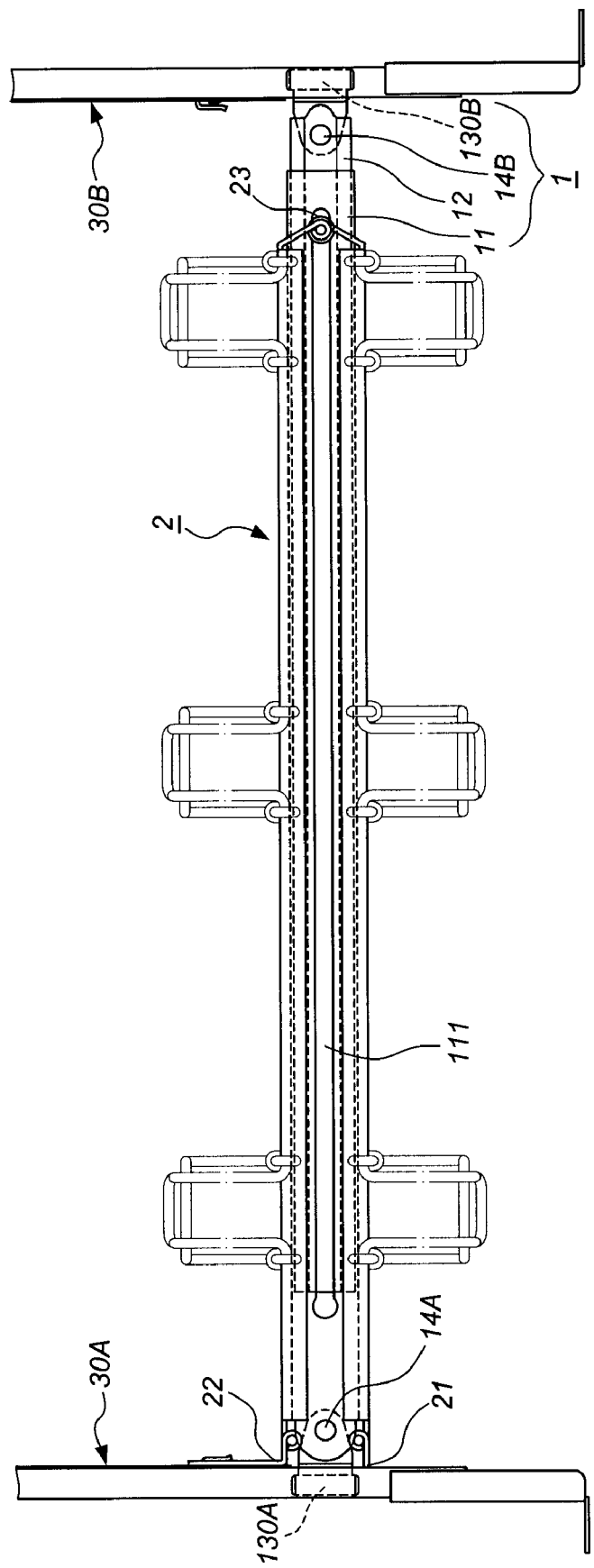
FIG. 2 is a top view of the first preferred embodiment of the present invention.
Figure 3:
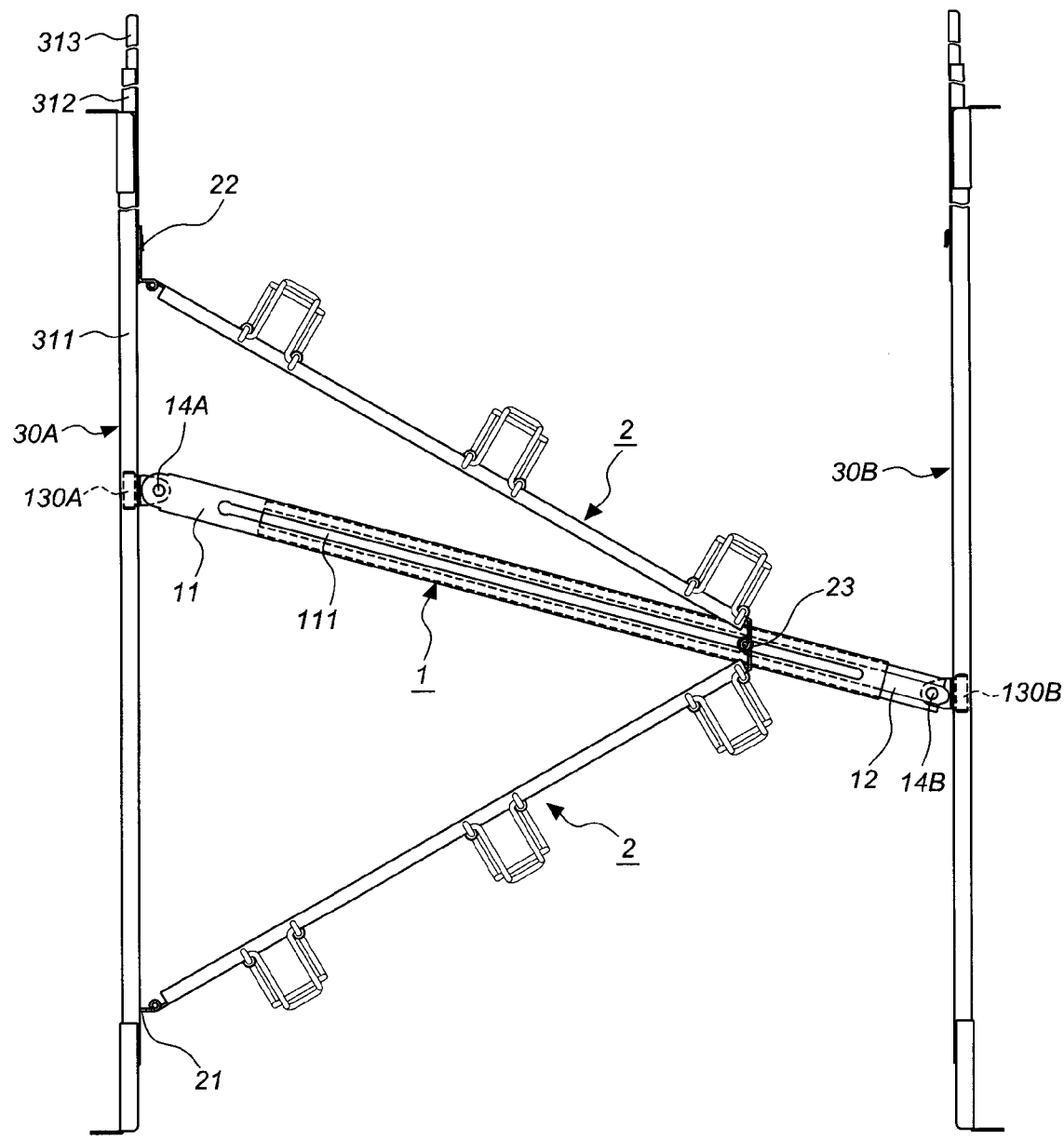
FIG. 3 is a top view showing the operation of the first preferred embodiment of the present invention.

Referring to FIGS. 1, 2 and 3 for a first preferred embodiment of the present invention, these illustrate a support slide assembly (1) in conjunction with a cable management arm (2) having a first end (21) and a second end (22) and two slide assemblies (3) which are a first slide assembly (30A) and a second slide assembly (30B). Each slide assembly includes a first slide rail (311), a second slide rail (312) slidably connected to the first slide rail (311), and a third slide rail (313) slidably connected to the second slide rail (312). The first end (21) of the cable management arm (2) is connected to the first slide rail (311) of the first slide assembly (30A) and the second end (22) of the cable management arm (2) is slidably connected to the third slide rail (313) of the first slide assembly (30A). A sliding member (23) is provided between the first and second ends (21, 22) of the cable management arm (2). The sliding member (23) is sustained by the support slide assembly (1) to slide in relation with the support slide assembly (1).

The support slide assembly (1) includes a first rod (11), a second rod (12) slidably connected to the first rod (11), a first sliding block (130A) movably connected to the first rod (11), a second sliding block (130B) movably connected to the second rod (12), a first pivoting pin (14A) and a second pivoting pin (14B). The first sliding block (130A) is connected to the first slide assembly (30A) and the second sliding block (130B) is connected to the second slide assembly (30B). Preferably, one end of the first rod (11) is pivoted to the first sliding block (130A) by means of the first pivoting pin (14A), and one end of the second rod (12) is pivoted to the second sliding block (130B) by means of the second pivoting pin (14B). Both the first rod (11) and the second rod (12) slide into each other to become one retractable piece, allowing change of its total length. A slot (111) is formed on the first rod (11) to receive insertion of the sliding member (23) for it to slide along the slot (111).

Figure 4:
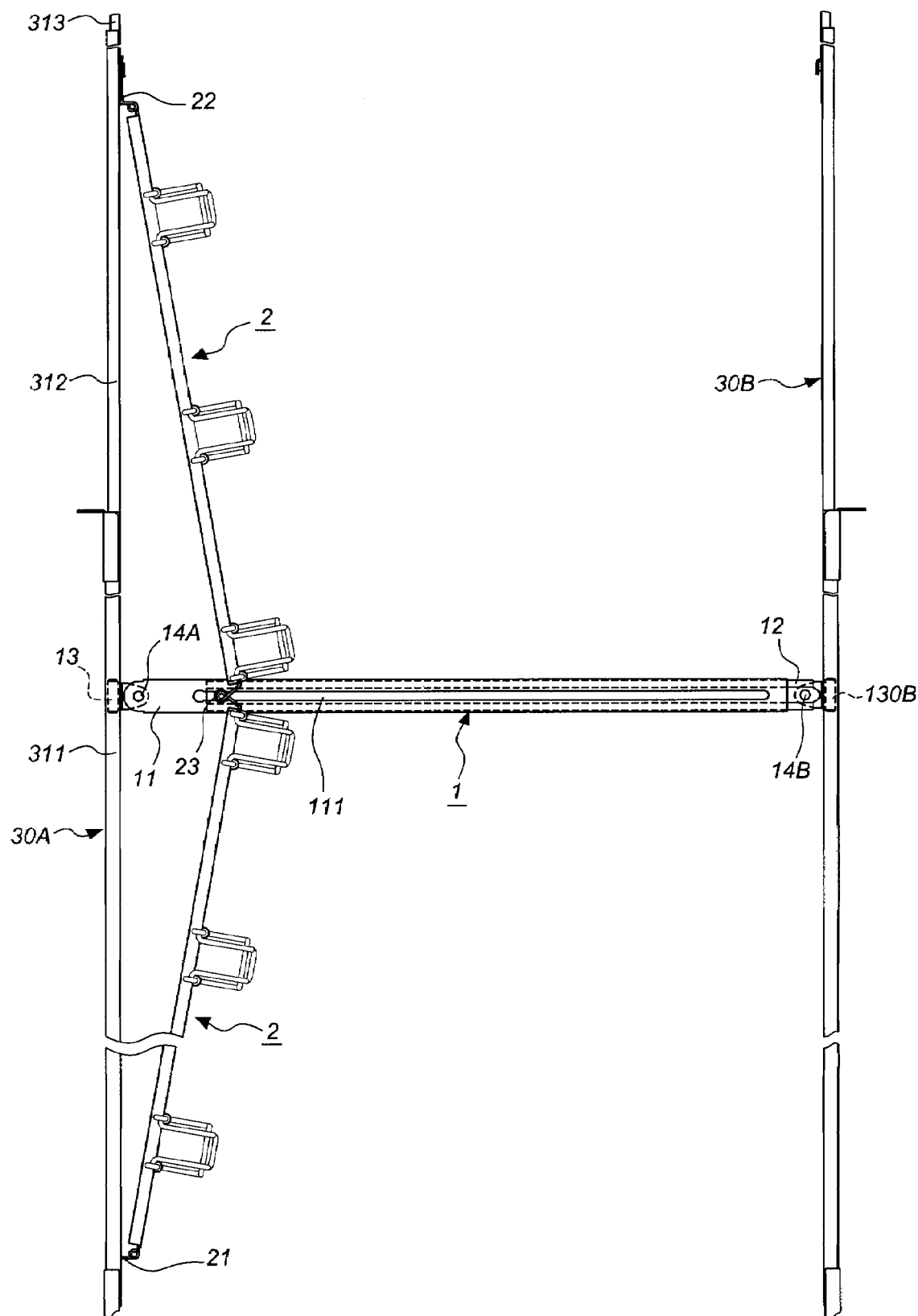
FIG. 4 is another top view showing the operation of the first preferred embodiment of the present invention.

As illustrated in FIGS. 3 and 4, the first preferred embodiment of the present invention when in operation, the support slide assembly (1) is retractable and in a position at a certain inclination in relation to the first and second slide assemblies (30A), (30B) due to the first rod (11) and the second rod (12). Accordingly, when the cable management arm (2) is stretched out or retracted, the sliding member (23) is able to easily slide along the slot (111) while driving the support slide assembly (1) to travel in relation to the first and second slide assemblies (30A), (30B) by means of the first and second sliding blocks (130A), (130B) of the support slide assembly (1). Meanwhile, the weight of the cable management arm (2) and the cable are jointly born by the two ends (21, 22) of the cable management arm (2) and the first and second sliding blocks (130A), (130B) respectively disposed on the two ends of the support slide assembly (1).

Figure 5:
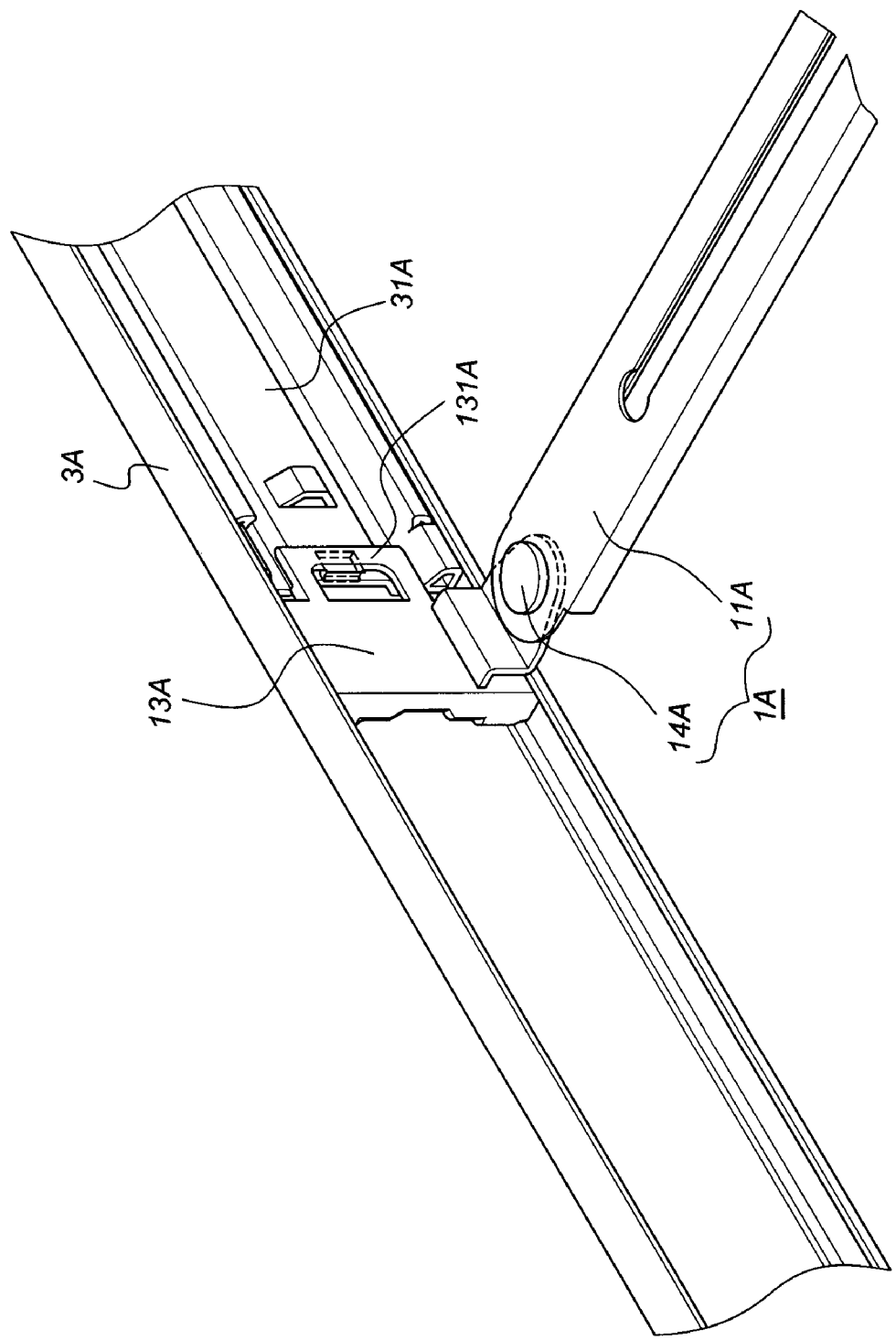
FIG. 5 is a perspective view showing connection between a support slide assembly and a slide in a second preferred embodiment of the present invention.

FIG. 5 is a perspective view of a second preferred embodiment of the present invention, which is substantially similar to the first preferred embodiment with the exceptions described hereinafter. One end of the support slide assembly (1A) is connected to a first slide assembly (3A). One end of a first rod (11A) of the support slide assembly (1A) is movably connected to a first sliding block (13A). Preferably, one end of the first rod (11A) is pivoted to the first sliding block (13A) by means of a first pivoting pin (14A). A joint (131A) is provided on the first sliding block (13A) for the first sliding block (13A) to be connected to a second slide rail (31A) of the first slide assembly (3A) such that the first sliding block (13A) synchronously travels with the second slide rail (31A). Preferably, the first sliding block (13A) is connected to one end of the second slide rail (31A) of the first slide assembly (3A).

Figure 6:
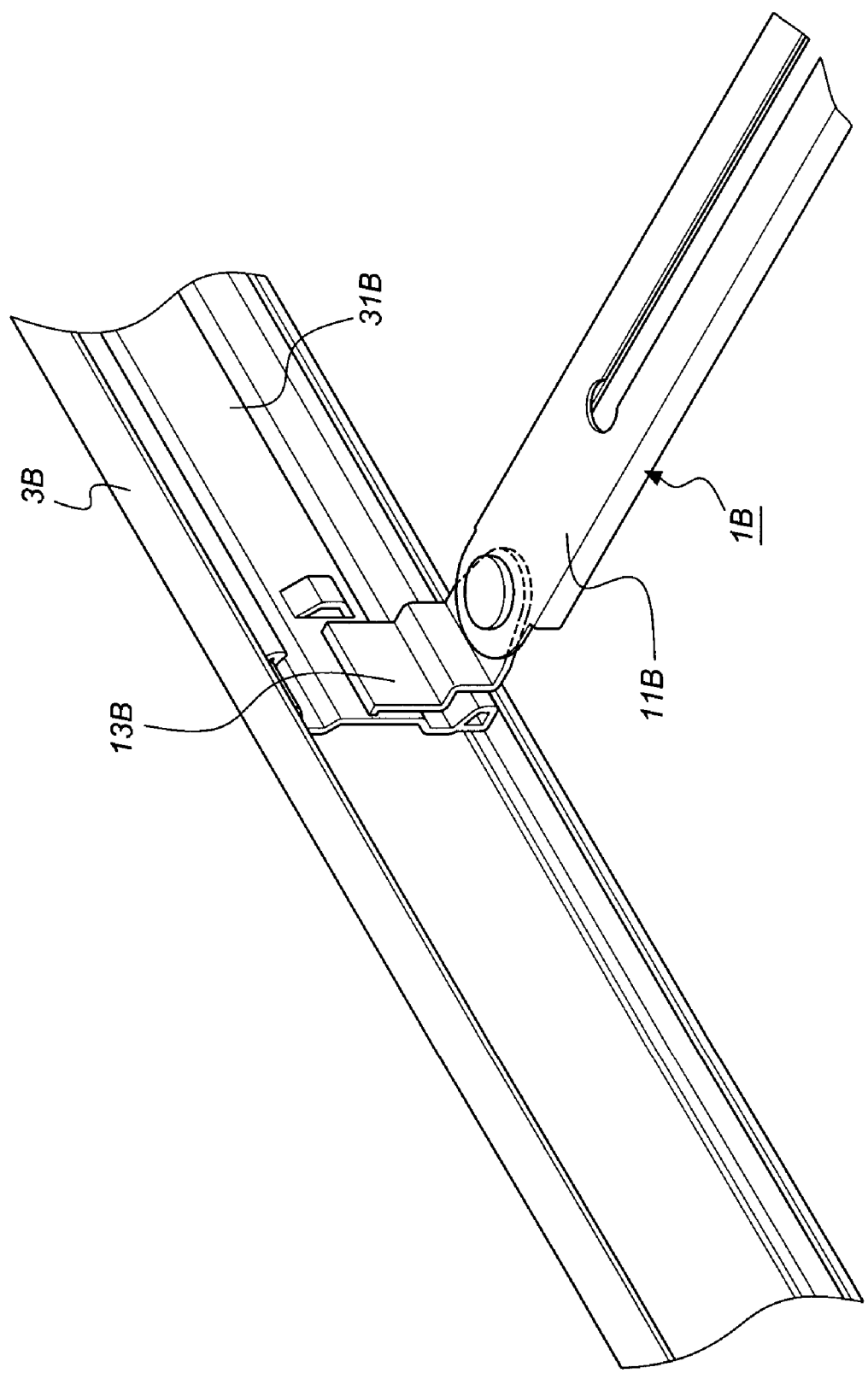
FIG. 6 is a perspective view showing connection between a support slide assembly and a slide in a third preferred embodiment of the present invention.

Furthermore, as illustrated in FIG. 6 showing a connection between a support slide assembly (1B) and a first slide assembly (3B) in a third preferred embodiment of the present invention, a first rod (11B) of the support slide assembly (1B) is directly connected to a second slide rail (31B) of the first slide assembly (3B) by means of a first sliding block (13B) thus for the first rod (11B) to travel as the second slide rail (31B) slides. Preferably, the first rod (11B) is pivotably connected to the second slide rail (31B) of the first slide assembly (3B) so that the first rod (11B) synchronously travels with the second slide rail (31B) of the first slide assembly (3B).

Figure 7:
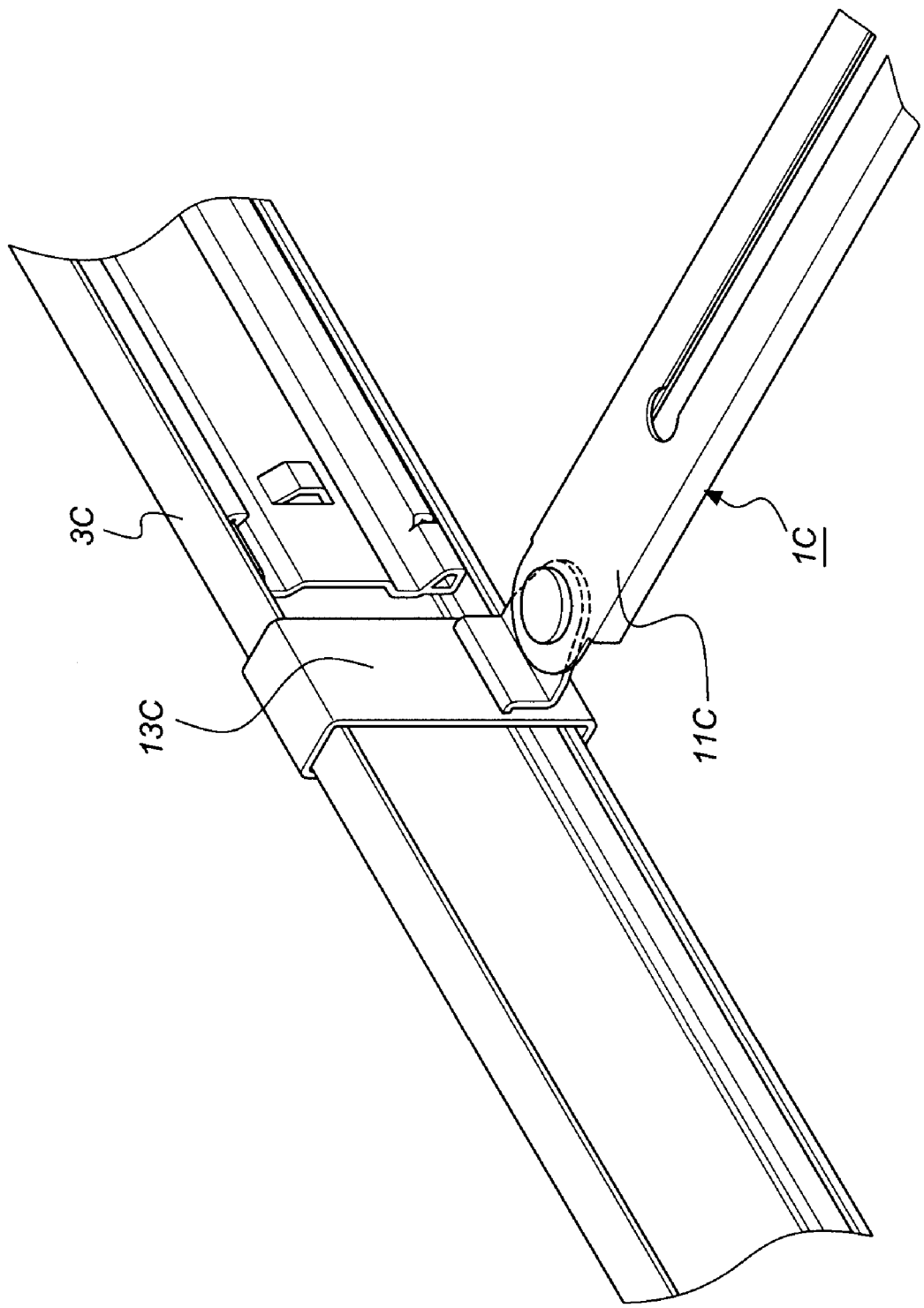
FIG. 7 is a perspective view showing connection between a support slide assembly and a slide in a fourth preferred embodiment of the present invention.

As illustrated in FIG. 7 for a perspective view of a connection between a support slide assembly (1C) and a first slide assembly (3C) in a fourth preferred embodiment of the present invention, a first rod (11C) and the first slide assembly (3C) are connected in a fashion that a sliding block (13C) connecting the first rod (11C) is made in the form of a square ring with the first slide assembly (3C) inserted through therein.

What is claimed is:

1. A support slide assembly for a cable management arm having a first end and a second end in conjunction with a first slide assembly and a second slide assembly each including a first slide rail, a second slide rail slidably connected to the first slide rail, and a third slide rail slidably connected to the second slide rail, the first end of the cable management arm being connected to the first slide rail of the first slide assembly and the second end of the cable management arm being connected to the third slide rail of the first slide assembly, the support slide assembly comprising:
   a first rod pivotably connected to the second slide rail of the first slide assembly so that the first rod synchronously travels with the second slide rail of the first slide assembly;
   a second rod slidably connected to the first rod;
   a sliding member provided between the first and second ends of the cable management arm, the sliding member being slidably connected to the first rod; and
   a second sliding block movably connected to the second rod, the second sliding block being further connected to the second slide assembly;
   wherein the sliding member is able to slide in the first rod when the cable management arm is stretched out or retracted;
   wherein the first and second rods are movable and in a position at a certain inclination in relation to the first and second slide assemblies when the cable management arm is stretched out.

2. The support slide assembly of claim 1, wherein the first rod includes a slot for receiving the sliding member able to slide in the slot.

3. The support slide assembly of claim 1, further comprising a first sliding block movably connected to the first rod, wherein the first sliding block is connected to the second slide rail of the first slide assembly.

4. The support slide assembly of claim 3, wherein the first sliding block has a joint connected to one end of the second slide rail of the first slide assembly.

\* \* \* \* \*